(12) United States Patent
Huh (10) Patent No.: US 7,186,603 B2
(45) Date of Patent: Mar. 6, 2007

(54) METHOD OF FORMING NOTCHED GATE STRUCTURE

(75) Inventor: Yun Jun Huh, Shanghai (CN)

(73) Assignee: Grace Semiconductor Manufacturing Corporation, Shanghai (CN)

(*) Notice: Subject to any disclaimer, the term of this patent is extended or adjusted under 35 U.S.C. 154(b) by 292 days.

(21) Appl. No.: 10/986,765

(22) Filed: Nov. 15, 2004

(65) Prior Publication Data
US 2006/0105531 A1    May 18, 2006

(51) Int. Cl.
*H01L 21/338*    (2006.01)
(52) U.S. Cl. ........................... 438/182; 438/197
(58) Field of Classification Search ............ 438/197, 438/199, 182, 183, 271
See application file for complete search history.

(56) References Cited
U.S. PATENT DOCUMENTS
6,461,904 B1 * 10/2002 Jin et al. ............... 438/182
2002/0110985 A1 * 8/2002 Tseng ................... 438/268

* cited by examiner

*Primary Examiner*—Thanhha S. Pham
(74) *Attorney, Agent, or Firm*—Rosenberg, Klein & Lee (57) ABSTRACT

A method of forming a notched gate structure comprising a semiconductor substrate having a first oxide layer formed thereon. A first conductive layer is formed on the semiconductor substrate. A portion of the first conductive layer and a portion of the first oxide layer are removed to form first gate structures. First spacers are formed on the sidewalls of the gate structure. A second oxide layer is formed on the semiconductor substrate. A second conductive layer is formed on the surface of the second oxide layer. The first gate structures and the second conductive layer formed thereon are then removed to form a second gate structure. Second spacers are formed on the sidewalls of the second gate structure to complete the notched gate structure process. The method of the present invention reduces the capacitance between the gate and the source/drain extension, and simplifies the process, thereby increasing the controllability of the process.

14 Claims, 7 Drawing Sheets

METHOD OF FORMING NOTCHED GATE STRUCTURE

BACKGROUND OF THE INVENTION

1. Field of the Invention

The present invention relates to a method of forming a gate structure, and more particularly, to a method of forming a notched gate structure.

2. Description of the Prior Art

The accelerating rate of improvement in the performance of advanced generations of CMOS IC's has been enabled by the aggressive scaling of the minimum lithographic feature size and supply voltages as well as innovations in transistor structure, and the addition of higher-levels of systems functionality of the IC design.

Fabrication of a metal oxide semiconductor field-effect transistor ("MOSFET") device is well known. As the dimension of the device shrinks to several nm, the parasitic capacitance between the gate and the source/drain extension increases in importance but limits the performance and the electrical quality of the MOSFET. Therefore, a notched gate structure is provided in order to reduce the parasitic capacitance between the gate and the source/drain extension. However, the notched gate structure of the conventional process uses isotropic etching. When performing the isotropic etching, the notched structure and the size are not easily controlled due to some processes having the same etching ratio. Therefore, the yield of the semiconductor devices and the throughout of product are limited.

As semiconductor devices become increasingly integrated, the line width becomes smaller. The etching result is difficult of control by using the notched gate structure to reduce the parasitic capacitance between the gate and the source/drain extension. The stability of devices are further influenced, thereby resulting in greater difficulty in fabricating the smaller semiconductor devices and reduces the yield and the electrical quality of devices.

Therefore, the present invention provides a method of forming a notched gate structure in order to overcome the disadvantages existing in the conventional process.

SUMMARY OF THE INVENTION

The present invention provides a method of forming a notched gate structure, in which the implantation step of forming the lightly doped drain LDD benefits by increasing the sensitivity of doping ions and forming of the silicon substrate.

The present invention also provides a method of a forming notched gate structure, in which the microloading effect is reduced and the wafer to wafer stability is improved.

The present invention also provides a method of forming a notched gate structure, which reduces the resistivity of the self-aligned salicide and simplifies the controllability of the process, thereby increasing the process stability.

To achieve the aforementioned objects, a preferred embodiment of the present invention provides a method of forming a notched gate structure. Firstly, a semiconductor substrate having a first oxide layer is provided. A first conductive layer is formed on the first oxide layer. A portion of the first conductive layer and a portion of the first oxide layer are removed to form a plurality of first gate structures. First spacers are formed on the sidewalls of the first gate structure. A second oxide layer is formed on the semiconductor layer. A second conductive layer is formed on the surface of the second oxide layer. The gate structure and second conductive layer formed thereon are removed to form a second gate structure. Second spacers are formed on the sidewalls of the gate structure to complete the notched gate structure process. The second gate structure has a narrower bottom side and a wider top side.

These and other objectives of the present invention will become obvious to those of ordinary skill in the art after reading the following detailed description of the preferred embodiment.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Figure 1A:
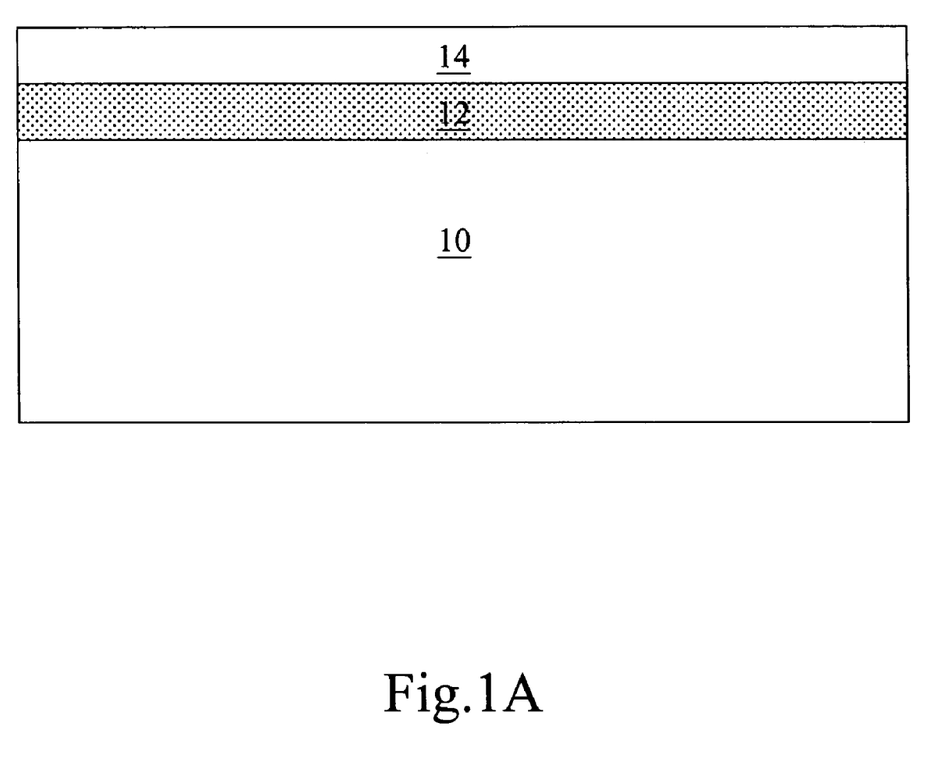
FIGS. 1A through 1G are sectional diagrams illustrating the structure of each step for forming a notched gate structure according to a preferred embodiment of the present invention.

FIGS. 1A through 1G are sectional diagrams illustrating the structure of each step for forming a notched gate structure according to a preferred embodiment of the present invention. As shown in the Figures, the method of the present invention comprises; firstly, providing a semiconductor substrate 10, which is typically a silicon substrate. Refer to FIG. 1A, a first dielectric layer 12 and a first conductive layer 14 in sequence are formed on the semiconductor substrate 10 by using, for example, Chemical Vapor Deposition. The first conductive layer 14 is typically a polysilicon layer and the thickness is between 100 and 200 angstroms (Å). The doping is optional. The first dielectric layer 12 is typically an oxide layer formed on the surface of the silicon substrate and the thickness is about 100 angstroms. The properly isolation structure or the doped area is formed in the semiconductor substrate 10 (not shown in the drawing), for example, a field oxide layer, a shallow trench isolation (STI) structure or a doped well, thereby defining the active area. These structures are completed by integrated circuit processing.

Figure 1B:
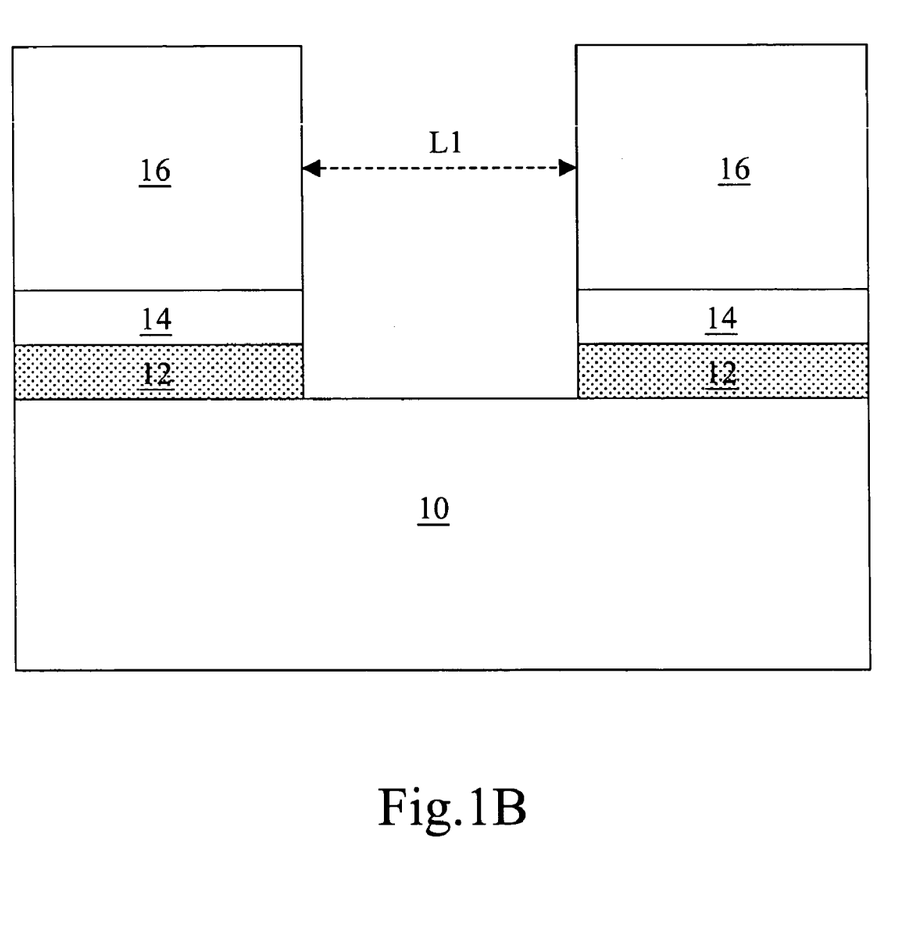

Refer to FIG. 1B, a patterned photoresist layer 16 is formed on the first conductive layer 14. Using this patterned photoresist layer 16 as a mask, an etching is performed to remove a portion of the first conductive layer 14 and a portion of the first dielectric layer 12 to form a temporary gate structure composed of the remaining first conductive layer 14 and the first dielectric layer 12. The top distance between these two adjacent temporary gate structures is represented by "L1".

Figure 1C:
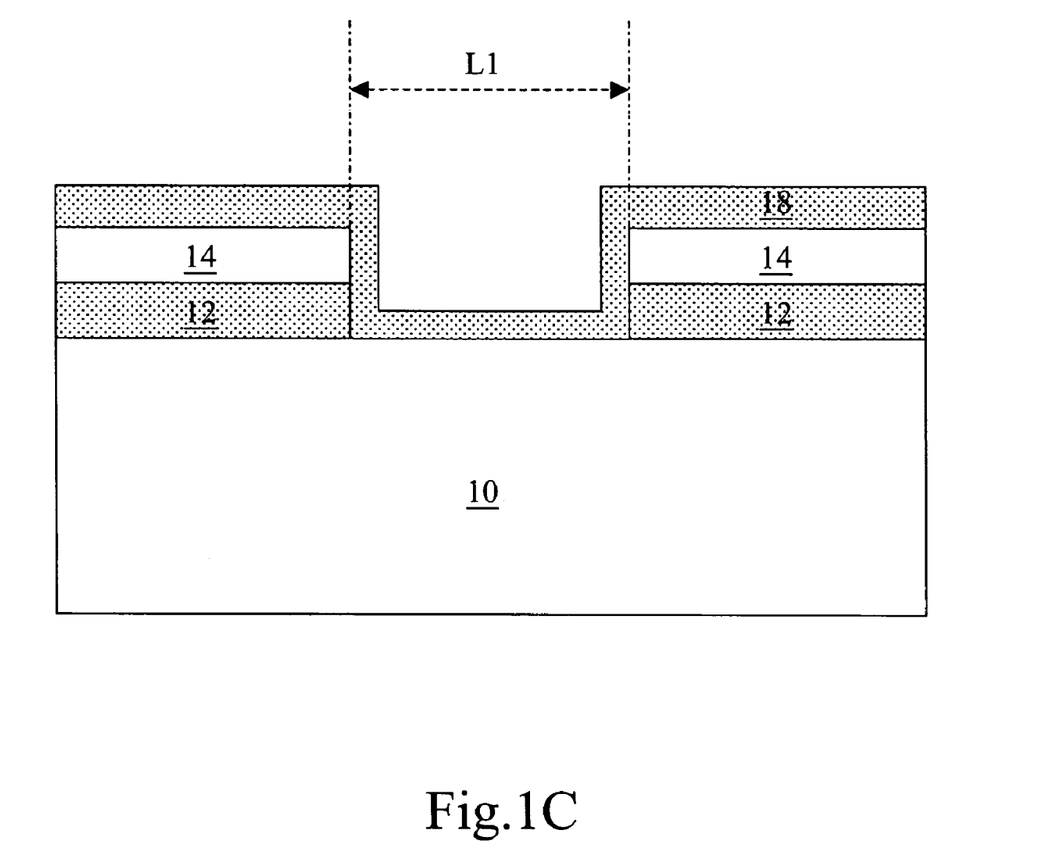
Figure 1D:
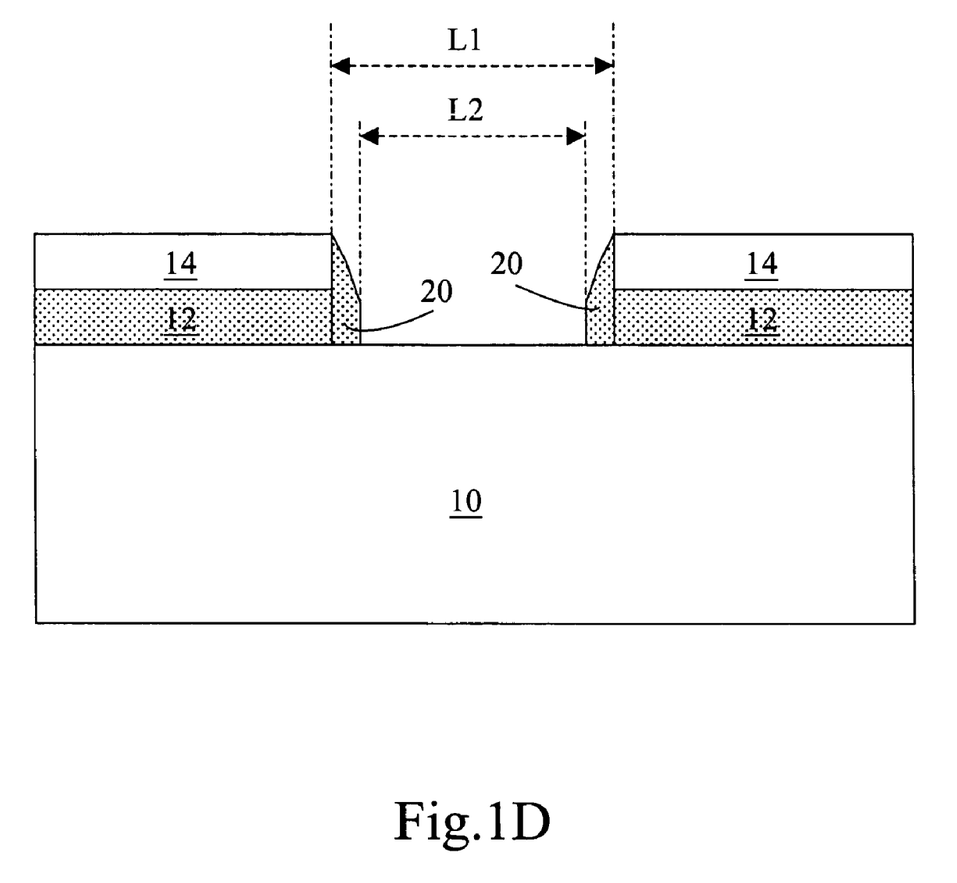

Next, as shown in FIG. 1C, a second dielectric layer 18, for example, a silicon oxide layer, is formed on the semiconductor substrate 10 by using, for example, Chemical Vapor Deposition to cover the top of the temporary gate structure. A portion of the second dielectric layer 18 is removed by using an etching process to leave a portion of the second dielectric layer 18 on two sides of the temporary gate structure, as the first spacers 20 formed on the two sides of the temporary gate structure shown in FIG. 1D. The distance between the two first spacers 20 is represented by "L2".

Figure 1E:
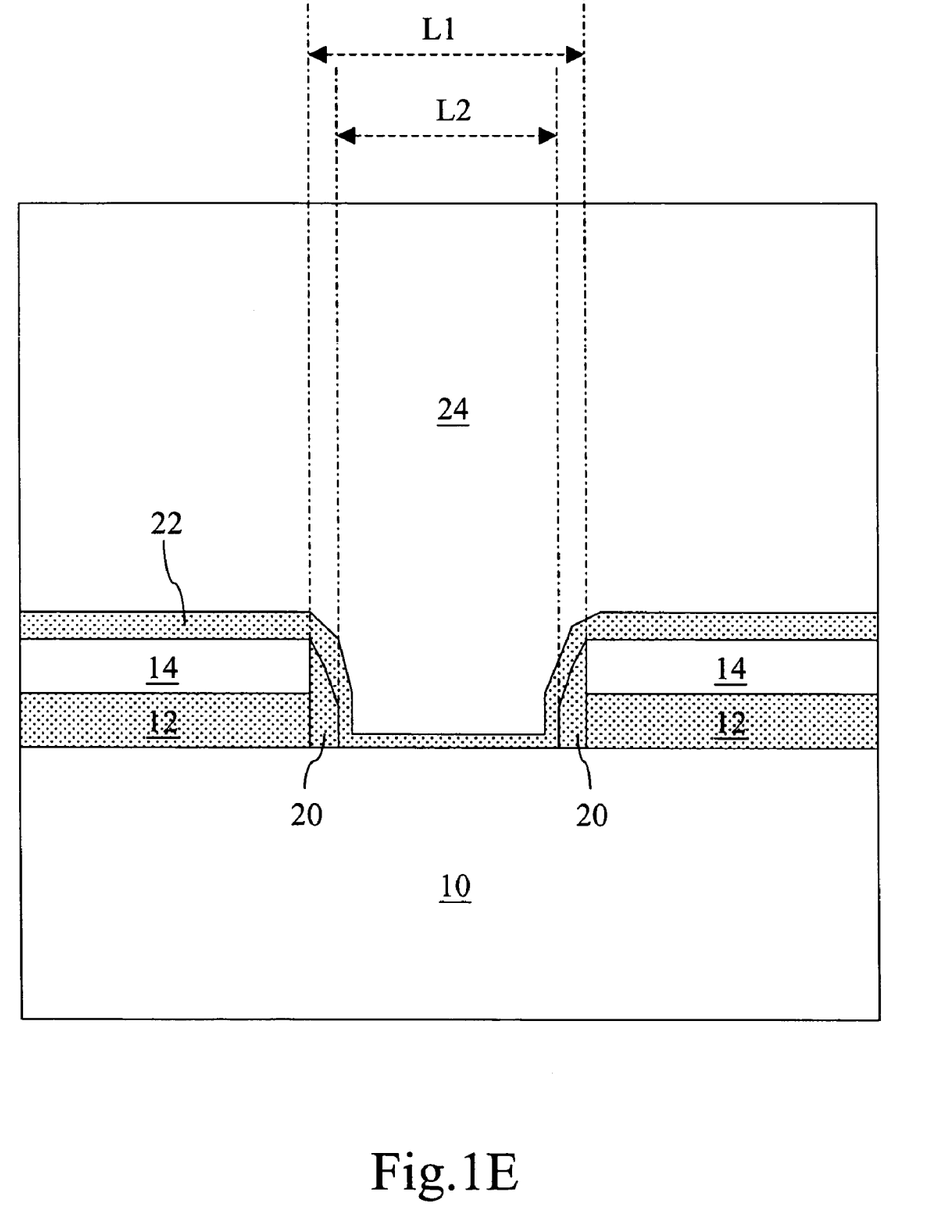

As shown in FIG. 1E, a third dielectric layer 22, for example, a silicon oxide layer, is formed over the surfaces of the semiconductor substrate 10, the temporary gate structure, and the first spacers 20. A second conductive layer 24, for example, a polysilicon layer, is then deposited on the surface of third dielectric layer 22.

Figure 1F:
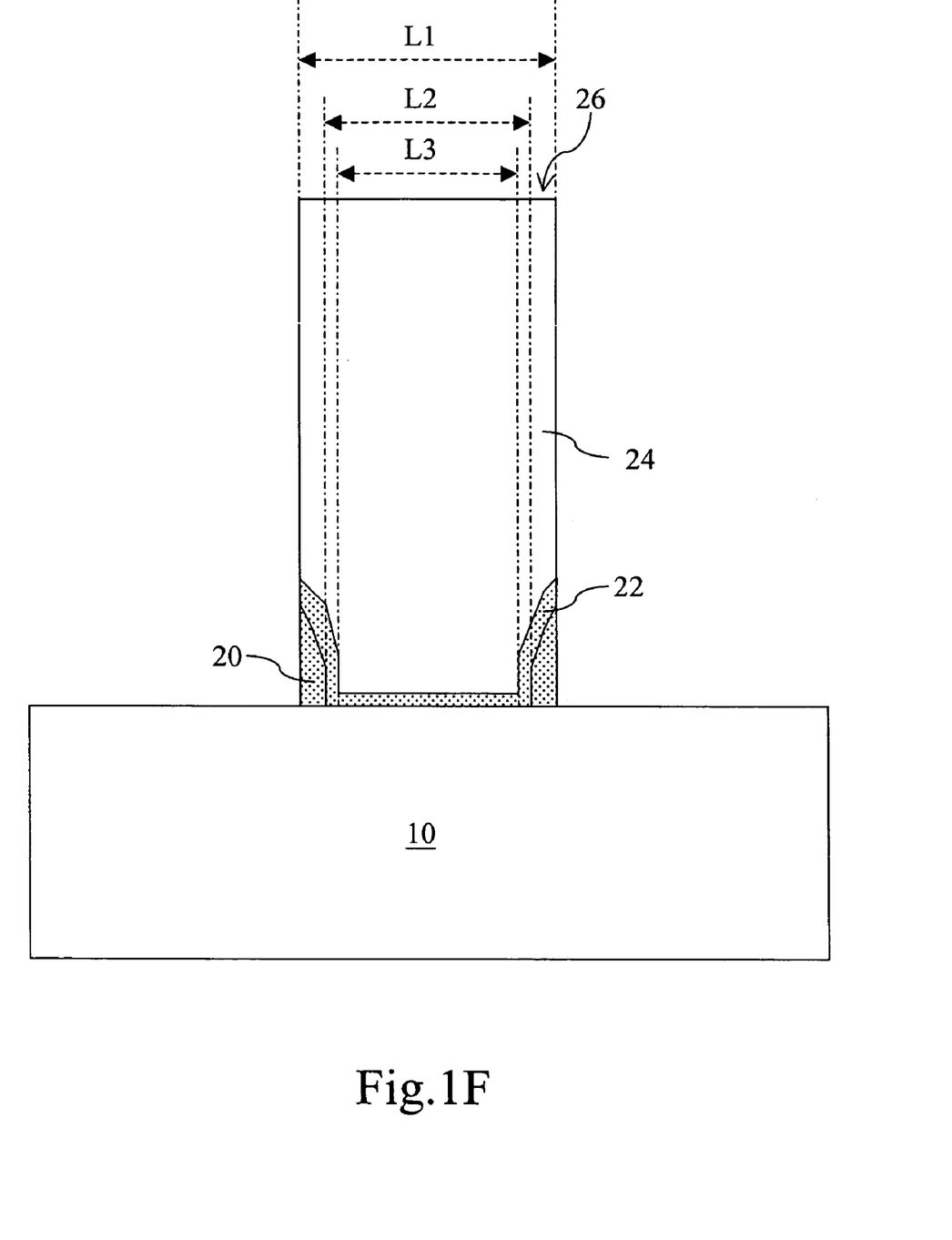

Refer to FIG. 1F, a lithography process is performed to remove a portion of second the conductive layer 24 and a portion of the third dielectric layer 22 and the temporary gate structures to form a notched gate structure 26 on the semiconductor substrate 10. This notched gate structure 26 is composed of the second conductive layer 24, third dielectric layer 22, and the spacers 22. It should be noted that the bottom of the notched gate structure 26 contacts the semiconductor substrate 10. The width of the bottom side of the notched gate structure 26 is represented by "L3", which is narrower than the length of top distance "L1".

Next, a pre-doping of lightly doped drain (LDD) is formed on the semiconductor substrate 10 by using an ion implantation step (not shown in the drawing). The ion implantation step of forming the LDD is beneficial for increasing the sensitivity of doping ions and forming of the silicon substrate. In addition, the wafer to wafer stability increases as well as reducing the microloading effect.

Figure 1G:
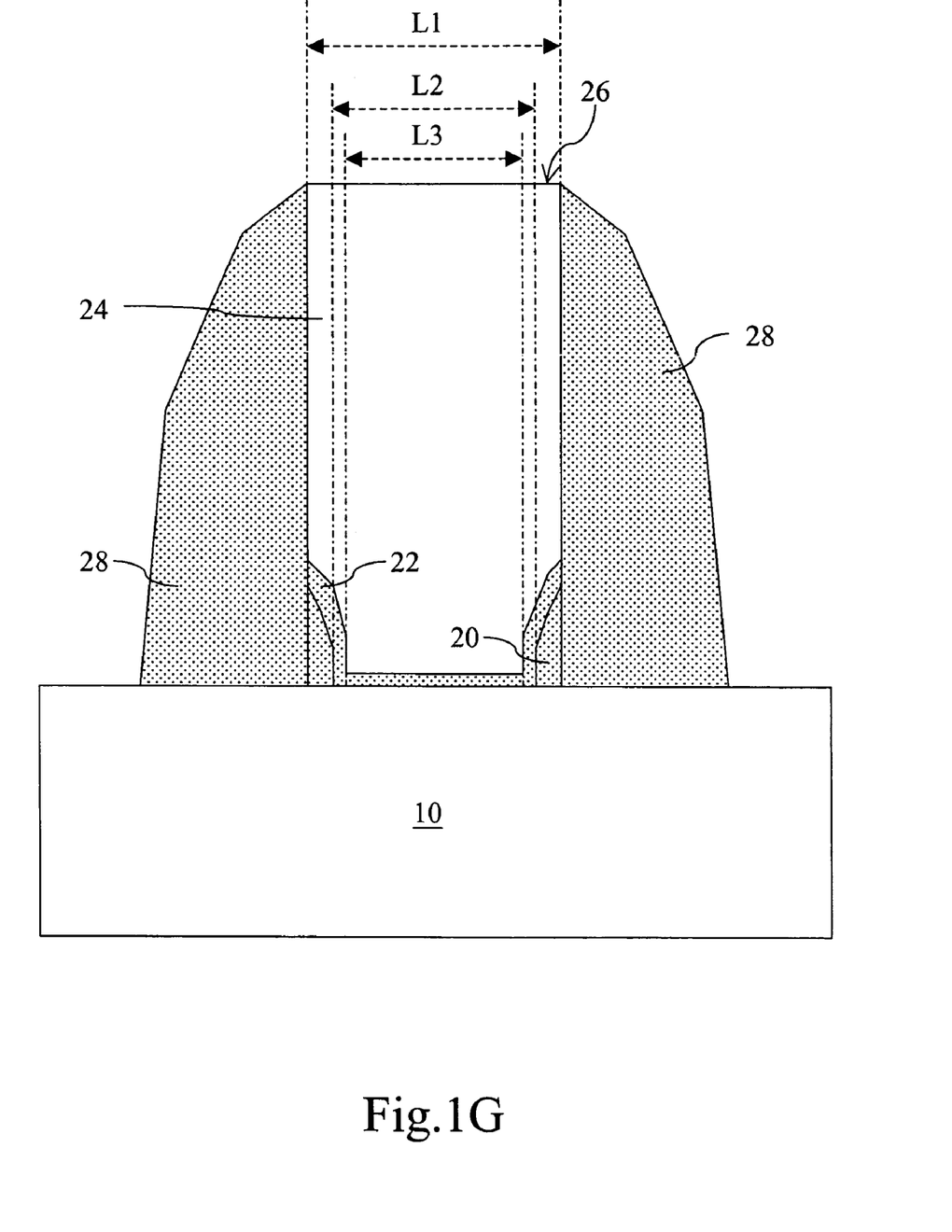

Shown in FIG. 1G, second spacers 28 are respectively formed on the sidewalls of the notched gate structure 26 by using, for example, deposition and etching processes. Further, using the notched gate structure 26 and the second spacers 28 as a mask, the subsequent ion implantation step is performed on the semiconductor substrate 10 to form the source and drain region (not shown in the drawing) in the semiconductor substrate 10. Finally, after completing the entire notched gate structure 26 of the semiconductor device, the subsequent semiconductor processes can be performed. For example, self-aligned salicide is formed to complete the subsequent semiconductor structure.

Therefore, the present invention provides a method of forming a notched gate structure, which is widely applied in semiconductor processing. The gate structure and the spacer structure are formed on the semiconductor substrate by a two-way method. This notched gate structure reduces the parasitic capacitance between the polysilicon layer and the source/drain extension, reduces the resistivity of the self-aligned salicide, simplifies the controllability of the processing, thereby increasing the process stability. The characteristics of the device are maintained while shrinking the device, thereby increasing the yield of the product.

The embodiment above is only intended to illustrate the present invention; it does not, however, to limit the present invention to the specific embodiment. Accordingly, various modifications and changes may be made without departing from the spirit and scope of the present invention as described in the following claims.

What is claimed is:

1. A method of forming a notched gate structure, comprising:
    providing a semiconductor substrate having a first oxide layer formed thereon;
    forming a first conductive layer on the first oxide layer;
    removing a portion of the first oxide layer and a portion of the first conductive layer to form a plurality of first gate structures;
    forming first spacers respectively on sidewalls of the first gate structures;
    forming a second oxide layer on the semiconductor the first spacers and the first gate structures substrate;
    forming a second conductive layer on he second oxide layer;
    removing the first gate structures and portions of the second conductive layer and the second oxide layer on the first gate structures form a second gate structure; and
    forming a second spacer on sidewalls of the second gate structure.

2. The method of forming a notched gate structure of claim 1, wherein the second gate structure is composed of the second conductive layer, the second oxide layer, and the first spacers.

3. The method of forming a notched gate structure of claim 1, further comprising implanting a plurality of first ions into the semiconductor substrate to form a plurality of lightly doped drain (LDD) regions before forming the second spacer.

4. The method of forming a notched gate structure of claim 1, further comprising implanting a plurality of second ions into the semiconductor substrate to form a plurality of source and drain regions after forming the second spacer.

5. The method of forming a notched gate structure of claim 1, wherein the first conductive layer is a polysilicon layer.

6. The method of forming a notched gate structure of claim 1, wherein the second conductive layer is a polysilicon layer.

7. The method of forming a notched gate structure of claim 1, wherein forming the plurality of the first gate structures further comprises;
    forming a patterned photoresist layer on the first conductive layer;
    etching the first conductive layer and the first oxide layer by using the patterned photoresist layer as a mask; and
    removing the photoresist layer.

8. A method of forming a notched gate structure, comprising:
    providing a semiconductor substrate having a first oxide layer formed thereon;
    forming a first polysilicon layer on the first oxide layer;
    removing a portion of the first polysilicon layer and a portion of the first oxide layer to form a plurality of first gate structures;
    forming first spacers respectively on sidewalls of the first gate structures;
    forming a second oxide layer on the semiconductor the first spacers and the first gate structures substrate;
    forming a second polysilicon layer on the second oxide layer;
    removing the first gate structures and portions of the second polysilicon layer and the second oxide layer formed on the first gate structures form a second gate structure; and
    forming a second spacer on sidewalls of the second gate structure.

9. The method of forming a notched gate structure of claim 8, wherein the second gate structure is composed of the second polysilicon layer, the second oxide layer, and the first spacers.

10. The method of forming a notched gate structure of claim 8, further comprising implanting a plurality of first ions into the semiconductor substrate to form a plurality of lightly doped drain regions (LDD) before forming the second spacer.

11. The method of forming a notched gate structure of claim 8, further comprising implanting a plurality of second ions into the semiconductor substrate to form a plurality of source and drain regions after forming the second spacer.

12. The method of forming a notched gate structure of claim 8, wherein the semiconductor substrate is a silicon substrate.

13. The method of forming a notched gate structure of claim 8, wherein the first spacers are composed of silicon oxide.

14. The method of forming a notched gate structure of claim 8, wherein the second spacer is composed of silicon oxide.

* * * * *